(12) United States Patent
Yoshida et al.

(10) Patent No.: US 11,220,089 B2
(45) Date of Patent: *Jan. 11, 2022

(54) LAMINATE, ITS MANUFACTURING METHOD, AND GATE SEAL

(71) Applicant: VALQUA, LTD., Tokyo (JP)

(72) Inventors: Nobuhiro Yoshida, Gojo (JP); Masayuki Noguchi, Machida (JP); Hiromi Kinoshita, Gojo (JP)

(73) Assignee: VALQUA, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/495,423

(22) PCT Filed: Mar. 22, 2018

(86) PCT No.: PCT/JP2018/011359
§ 371 (c)(1),
(2) Date: Sep. 19, 2019

(87) PCT Pub. No.: WO2018/180866
PCT Pub. Date: Oct. 4, 2018

(65) Prior Publication Data
US 2020/0009834 A1     Jan. 9, 2020

(30) Foreign Application Priority Data
Mar. 30, 2017   (JP) .............................. JP2017-066653

(51) Int. Cl.
*B32B 15/08*      (2006.01)
*B32B 15/20*      (2006.01)
(Continued)

(52) U.S. Cl.
CPC .............. *B32B 15/08* (2013.01); *B32B 15/20* (2013.01); *B32B 25/08* (2013.01); *C25D 11/04* (2013.01);
(Continued)

(58) Field of Classification Search
None
See application file for complete search history.

(56) References Cited

U.S. PATENT DOCUMENTS 4,085,012 A  *  4/1978  Marceau ................ C25D 11/08
                                                              156/151
5,374,484 A     12/1994  Kasahara et al.
(Continued)

FOREIGN PATENT DOCUMENTS

JP    H04-331150 A    11/1992
JP    H05-124168 A     5/1993
(Continued)

OTHER PUBLICATIONS

Machine translation of WO 2006/059474 A1 (Year: 2006).*
(Continued)

*Primary Examiner* — Ramsey Zacharia
(74) *Attorney, Agent, or Firm* — Westerman, Hattori, Daniels & Adrian, LLP

(57) ABSTRACT

Provided are a laminate including a metal substrate having a surface with an anodic oxide coating formed thereon, a fluororesin layer laminated in contact with the anodic oxide coating and a fluoroelastomer layer laminated in contact with a surface of the fluororesin layer facing away from the metal substrate, and a gate seal including the laminate.

10 Claims, 1 Drawing Sheet

(51) Int. Cl.
  *B32B 25/08* (2006.01)
  *C25D 11/04* (2006.01)
  *H01L 21/67* (2006.01)

(52) U.S. Cl.
  CPC ....... *B32B 2255/06* (2013.01); *B32B 2255/20* (2013.01); *H01L 21/67201* (2013.01)

(56) References Cited

U.S. PATENT DOCUMENTS

| | | | |
|---|---|---|---|
| 6,146,932 | A | 11/2000 | Roh |
| 2006/0201613 | A1 | 9/2006 | Minowa et al. |
| 2006/0292373 | A1 | 12/2006 | Kuboyama et al. |
| 2008/0287627 | A1* | 11/2008 | Noguchi ............... C08L 27/18 526/247 |
| 2014/0044975 | A1 | 2/2014 | Hayashi et al. |
| 2020/0024765 | A1 | 1/2020 | Noguchi et al. |

FOREIGN PATENT DOCUMENTS

| | | |
|---|---|---|
| JP | H05-177765 A | 7/1993 |
| JP | 5-261856 A | 10/1993 |
| JP | H06-100716 A | 4/1994 |
| JP | 6-157686 A | 6/1994 |
| JP | H08-118561 A | 5/1996 |
| JP | 2002-305373 A | 10/2002 |
| JP | 2004-36739 A | 2/2004 |
| JP | 2008-119894 A | 5/2008 |
| JP | 2008-532808 A | 8/2008 |
| JP | 2010-155443 A | 7/2010 |
| JP | 2012223888 A | 11/2012 |
| JP | 2014-152398 A | 8/2014 |
| JP | 2016-37023 A | 3/2016 |
| JP | 2018-172647 A | 11/2018 |
| KR | 10-2007-0000353 A | 1/2007 |
| KR | 10-2007-0116628 A | 12/2007 |
| WO | 2006059474 A1 | 6/2006 |

OTHER PUBLICATIONS

MasterBond(R), Causes of Adhesive and Cohesive Bond Failures. (Year: 2021).*
International Search Report dated May 22, 2018, issued in counterpart International Application No. PCT/JP2018/011359, with English translation (2 page).
Office Action dated Dec. 18, 2020, issued in counterpart KR Application No. 10-2019-7030817, with English Translation. (10 pages).
Non-Final Office Action dated Jan. 25, 2021, issued in U.S. Appl. No. 16/494,881 (16 pages).
Office Action dated Apr. 6, 2021, issued in JP Application No. 2018-052313, with English Translation (10 pages).
Office Action dated Jun. 15, 2021, issued in counterpart JP Application No. 2018-052314, with English translation. (6 pages).

* cited by examiner

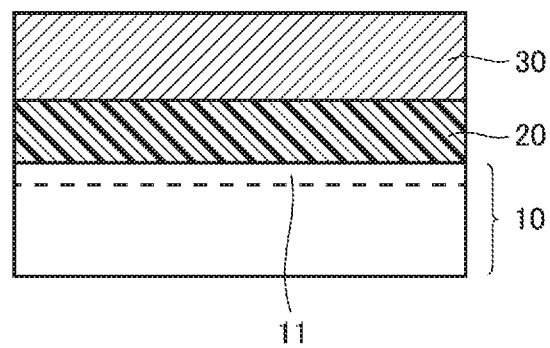

LAMINATE, ITS MANUFACTURING METHOD, AND GATE SEAL

TECHNICAL FIELD

The present invention relates to a laminate including a metal substrate and a fluoroelastomer layer, a method for manufacturing the laminate, and a gate seal including the laminate.

BACKGROUND ART

In general, a vacuum chamber of a semiconductor manufacturing apparatus is provided with a gate for loading and unloading an object to be processed, such as a wafer, and the gate is provided with a gate seal for opening and closing the gate. The gate seal is normally composed of a metal substrate and a seal material disposed in close contact with a surface of the metal substrate, and the seal material's sealing performance can hold the pressure difference between the interior and exterior of the chamber.

Japanese Patent Laying-Open No. H 06-157686 (patent literature 1) describes that a laminate formed by laminating a metal and a cured product of a fluorine-containing elastomer composition via an adhesive is applied to an oil seal, a crankshaft seal, etc.

CITATION LIST

Patent Literature

PTL 1: Japanese Patent Laying-Open No. H 06-157686

SUMMARY OF INVENTION

Technical Problem

The gate seal using an adhesive had room for improvement at least as indicated by the following points:

(a) Peeling may occur between the metal substrate and the seal material in a severe use environment (for example, a high temperature environment, a corrosive environment, a UV environment, a plasma environment, etc.). It is believed that this occurs because the adhesive decomposes in the severe use environment; and (b) Whenever the type of fluoroelastomer used for the seal material is changed, it is necessary to develop/select an appropriate adhesive, which is disadvantageous in terms of development cost.

An object of the present invention is to provide a laminate having an improved peel strength between a metal substrate and a fluoroelastomer layer, and a gate seal including the laminate.

Solution to Problem

The present invention provides a laminate, a method for manufacturing the laminate, and a gate seal, as indicated below:

[1] A laminate comprising:
a metal substrate having a surface with an anodic oxide coating formed thereon;
a fluororesin layer laminated in contact with the anodic oxide coating; and
a fluoroelastomer layer laminated in contact with a surface of the fluororesin layer facing away from the metal substrate.

[2] The laminate according to item [1], wherein the fluoroelastomer layer includes a crosslinked product of a crosslinkable perfluoroelastomer.

[3] The laminate according to item [1] or [2], wherein the anodic oxide coating has an arithmetic average roughness Ra, as defined in JIS B 0601: 1994, of 0.05 to 100 µm.

[4] The laminate according to any one of items [1] to [3], wherein the metal substrate includes aluminum.

[5] A gate seal comprising the laminate according to any one of items [1] to [4].

[6] A method for manufacturing a laminate, comprising:
providing a metal substrate having a surface with an anodic oxide coating formed thereon;
forming a fluororesin layer on a surface of the anodic oxide coating;
forming a layer including a crosslinkable fluoroelastomer on a surface of the fluororesin layer facing away from the metal substrate; and
crosslinking the layer including the crosslinkable fluoroelastomer to form a fluoroelastomer layer.

[7] The method for manufacturing a laminate according to item [6], wherein forming the fluororesin layer includes disposing fused fluororesin on a surface of the anodic oxide coating and subsequently solidifying the disposed, fused fluororesin.

[8] The method for manufacturing a laminate according to item [6] or [7], wherein the crosslinkable fluoroelastomer is a crosslinkable perfluoroelastomer.

[9] The method for manufacturing a laminate according to any one of items [6] to [8], wherein the anodic oxide coating has an arithmetic average roughness Ra, as defined in JIS B 0601: 1994, of 0.05 to 100 µm.

[10] The method for manufacturing a laminate according to any one of items [6] to [9], wherein the metal substrate includes aluminum.

Advantageous Effects of Invention

A laminate having an improved peel strength between a metal substrate and a fluoroelastomer layer (hereinafter also simply referred to as "peel strength"), and a gate seal including the laminate can be provided.

BRIEF DESCRIPTION OF DRAWING

FIG. 1 is a schematic cross section of an example of a laminate according to the present invention.

DESCRIPTION OF EMBODIMENTS

<Laminate>

Hereinafter, an embodiment will be indicated to specifically describe the present invention.

FIG. 1 is a schematic cross section of an example of a laminate according to the present invention. As shown in FIG. 1, the laminate according to the present invention comprises a metal substrate 10, a fluororesin layer 20 laminated in contact with a surface of metal substrate 10, and a fluoroelastomer layer 30 laminated in contact with a surface of fluororesin layer 20 facing away from metal substrate 10.

An anodic oxide coating 11 is formed on one surface of metal substrate 10. Fluororesin layer 20 is laminated in contact with a surface of anodic oxide coating 11.

(1) Metal Substrate

Metal substrate 10 is composed of metal that is anodizable, and examples of the metal include: aluminum; magnesium; titanium; an alloy containing aluminum, magnesium or titanium; stainless steel; and the like. Preferably, metal substrate 10 is composed of metal which is aluminum; titanium; or an alloy containing aluminum or titanium (for example, an aluminum alloy containing aluminum as a major component), more preferably a metal material containing aluminum, that is: aluminum; an alloy containing aluminum (for example, an aluminum alloy containing aluminum as a major component).

Metal substrate 10 can be shaped, as appropriate, such as desired when used as a gate valve. Metal substrate 10 has a thickness for example of about 1 to 30 mm.

Metal substrate 10 has at least one surface (for example, one major surface) with anodic oxide coating 11. Anodic oxide coating 11 is an oxide coating (a coating of metal oxide) formed on a surface of metal substrate 10 by an electrolysis process with metal substrate 10 as an anode. The electrolysis process may be done with any electrolyte, and an aqueous solution of sulfuric acid, oxalic acid, phosphoric acid, chromic acid, boric acid or the like can be used.

Anodic oxide coating 11 is normally a porous film. Anodic oxide coating 11 has a pore diameter for example of 0.05 to 100 μm, and, from the viewpoint of improvement in peel strength, preferably 0.1 to 50 μm, more preferably 2 to 30 μm. The pore diameter of anodic oxide coating 11 can be measured through SEM or TEM observation.

At least some of the pores of anodic oxide coating 11 preferably have introduced therein the fluororesin constituting fluororesin layer 20 laminated thereon. This is advantageous in improving peel strength.

Anodic oxide coating 11 is controllable in thickness by the amount of electric power (the amount of an electric current, the period of time for the electrolysis process, etc.) or the like when the anodization process is performed. Anodic oxide coating 11 has a thickness for example of 0.05 to 200 μm, and preferably 0.1 to 100 μm from the viewpoint of improvement in peel strength. Anodic oxide coating 11 may have a thickness of 0.1 to 50 μm, 1 to 40 μm, or 5 to 30 μm. Anodic oxide coating 11 can be measured in thickness for example by using a coating thickness gauge such as a FISCHERSCOPE "XDL 210" manufactured by Fischer Instruments K.K.

Anodic oxide coating 11 normally has a surface (a surface on which fluororesin layer 20 is laminated) with irregularity. From the viewpoint of improvement in peel strength, anodic oxide coating 11 has an arithmetic average roughness Ra, as defined in JIS B 0601: 1994, preferably of 0.05 to 100 μm, more preferably 0.1 to 50 μm, still more preferably 0.5 to 11 μm. From the viewpoint of improvement in peel strength, anodic oxide coating 11 has a maximum height roughness Ry, as defined in JIS B 0601: 1994, preferably of 0.05 to 150 μm, more preferably 0.1 to 100 μm, still more preferably 1 to 50 μm. From the viewpoint of improvement in peel strength, anodic oxide coating 11 has a ten-spot average roughness Rz, as defined in JIS B 0601: 1994, preferably of 0.1 to 120 μm, more preferably 1 to 120 μm, still more preferably 20 to 110 μm.

These surface roughness parameters can be measured with a laser microscope or through SEM observation.

(2) Fluororesin Layer

Fluororesin layer 20 is a layer composed of fluororesin. Fluororesin is a thermoplastic resin having a fluorine atom in a molecule, although elastomer is excluded from the fluororesin. One type of fluororesin may be used alone or two or more types of fluororesin may be used together.

Examples of the fluororesin are polytetrafluoroethylene (PTFE), a tetrafluoroethylene-perfluoroalkyl vinyl ether copolymer (PFA), a tetrafluoroethylene-hexafluoropropylene copolymer (FEP), a tetrafluoroethylene-ethylene copolymer (ETFE), polychlorotrifluoroethylene (PCTFE), a chlorotrifluoroethylene-ethylene copolymer (ECTFE), polyvinylidene fluoride (PVDF), polyvinyl fluoride (PVF), a vinylidene fluoride-hexafluoropropylene copolymer (a VDF-HFP copolymer), a vinylidene fluoride-hexafluoropropylene-tetrafluoroethylene copolymer (a VDF-HFP-TFE copolymer), and the like.

Inter alia, PFA, FEP, ETFE, and PVDF are preferably used from the viewpoint of improvement in peel strength.

The fluororesin preferably has a melting point of 310° C. or lower, more preferably 250° C. or lower, as such a melting point facilitates forming fluororesin layer 20 on the surface of anodic oxide coating 11 by fusion-bonding.

Fluororesin layer 20 has a thickness for example of 0.05 μm to 10 mm, and, from the viewpoint of improvement in peel strength and reduction in thickness of the laminate, preferably 0.1 μm to 5 mm, more preferably 10 μm to 2 mm, further preferably 20 μm to 1 mm, still more preferably 40 μm to 1 mm, and particularly preferably 50 to 500 μm.

Fluororesin layer 20 can include a component other than fluororesin. Examples of the component other than fluororesin include an additive described hereinafter for fluoroelastomer layer 30. However, from the viewpoint of improvement in peel strength, it is preferable that the additive is used in a small amount, and more specifically, the content of the fluororesin in fluororesin layer 20 is preferably 80% by weight or more, more preferably 90% by weight or more, still more preferably 95% by weight or more (e.g., 100% by weight).

The laminate according to the present invention has a layer configuration of metal substrate 10/fluororesin layer 20/fluoroelastomer layer 30, and can thus be excellent in peel strength between metal substrate 10 and fluoroelastomer layer 30. Moreover, the laminate according to the present invention allows fluororesin layer 20 interposed between metal substrate 10 and fluoroelastomer layer 30 to be fused by heating, and fluoroelastomer layer 30 can thus be easily separated from metal substrate 10 at a desired time so that metal substrate 10 can be recovered. This is advantageous in that for example, even when fluoroelastomer layer 30 is degraded as it is used, rather than replacing the entire laminate, the degraded fluoroelastomer layer 30 can be separated from metal substrate 10 and metal substrate 10 can be reused.

(3) Fluoroelastomer Layer

Fluoroelastomer layer 30 includes a crosslinked product of a crosslinkable fluoroelastomer. Fluoroelastomer layer 30 may consist of the crosslinked product of a crosslinkable fluoroelastomer.

Fluoroelastomer layer 30 can be formed by crosslinking a crosslinkable fluoroelastomer composition including a crosslinkable fluoroelastomer.

The crosslinkable fluoroelastomer is preferably one that can form a crosslinked structure by a crosslinking reaction between molecular chains and thereby form an elastomer (or crosslinked rubber) which exhibits rubber elasticity. It is preferable that the crosslinkable fluoroelastomer does not include thermoplastic elastomer.

Examples of the crosslinkable fluoroelastomer include crosslinkable perfluoroelastomer (FFKM) and other fluoroelastomers (F KM).

Examples of the FFKM include a tetrafluoroethylene (TFE)-perfluoro (alkyl vinyl ether)-based copolymer, a TFE-perfluoro (alkoxyalkyl vinyl ether)-based copolymer, and the like. These copolymers may further include a constitutional unit derived from other perfluoromonomers.

One type or two or more types of FFKMs can be used.

Perfluoro (alkyl vinyl ether) forming the tetrafluoroethylene (TFE)-perfluoro (alkyl vinyl ether)-based copolymer can have a carbon number of 1 to 10 in its alkyl group, and can for example be perfluoro (methyl vinyl ether), perfluoro (ethyl vinyl ether), perfluoro (propyl vinyl ether) and the like. Preferably, it is perfluoro (methyl vinyl ether).

Perfluoro (alkoxyalkyl vinyl ether) forming the TFE-perfluoro (alkoxy alkyl vinyl ether)-based copolymer can be such that a group bonded to a vinyl ether group ($CF_2$=CFO—) has a carbon number of 3 to 15, and it can for example be $CF_2$=$CFOCF_2CF(CF_3)OC_nF_{2n+1}$,
$CF_2$=$CFO(CF_2)_3OC_nF_{2n+1}$,
$CF_2$=$CFOCF_2CF(CF_3)O(CF_2O)_mC_nF_{2n+1}$, or
$CF_2$=$CFO(CF_2)OC_nF_{2n+1}$.

In the above formulas, n is for example 1 to 5 and m is for example 1 to 3.

Crosslinkability can be imparted to the FFKM by copolymerizing a monomer having a crosslinking site (or by including a constituent unit derived from the monomer). The crosslinking site means a site capable of a crosslinking reaction. Examples of the crosslinking site can be a nitrile group, a halogen group (e.g., an I group, a Br group etc.), a perfluorophenyl group, and the like.

An example of a monomer having a crosslinking site that has a nitrile group as the crosslinking site is a nitrile group-containing perfluorovinyl ether. The nitrile group-containing perfluorovinyl ether can for example be $CF_2$=$CFO(CF_2)_nOCF(CF_3)CN$ (n is for example 2 to 4),
$CF_2$=$CFO(CF_2)_nCN$ (n is for example 2 to 12),
$CF_2$=$CFO[CF_2CF(CF_3)O]_m(CF_2)_nCN$ (n is for example 2 and in is for example 1 to 5),
$CF_2$=$CFO[CF_2CF(CF_3)O]_m(CF_2)_nCN$ (n is for example 1 to 4 and m is for example 1 to 2),
$CF_2$=$CFO[CF_2CF(CF_3)O]_nCF_2CF(CF_3)CN$ (n is for example 0 to 4), and the like.

An example of the monomer having the crosslinking site that has a halogen group as the crosslinking site is a halogen group-containing perfluoro vinyl ether. The halogen group-containing perfluoro vinyl ether can for example be the above specific example of nitrile group-containing perfluoro vinyl ether with the nitrile group substituted with a halogen group.

The FFKM may have a crosslinking structure that crosslinks between two main chains.

In the FFKM, the ratio of a constitutional unit derived from TFE/a constitutional unit derived from perfluoro (alkyl vinyl ether) or perfluoro (alkoxy alkyl vinyl ether)/a constitutional unit derived from the monomer having the crosslinking site is normally 53.0 to 79.9%/20.0 to 46.9%/0.4 to 1.5% as a molar ratio.

Two or more types of FFKMs having different constitutional unit ratios can also be used.

FKM which is a fluoroelastomer other than FFKM is a fluoroelastomer having a hydrogen atom and a fluorine atom.

Examples of the FKM include a vinylidene fluoride (VDF)-hexafluoropropylene (HFP)-based polymer; a vinylidene fluoride (VDF)-hexafluoropropylene (HFP)-tetrafluoroethylene (TFE)-based polymer; a tetrafluoroethylene (TFE)-propylene (Pr)-based polymer; a vinylidene fluoride (VDF)-propylene (Pr)-tetrafluoroethylene (TFE)-based polymer; an ethylene (E)-tetrafluoroethylene (TFE)-perfluoromethyl vinyl ether (PMVE)-based polymer; a vinylidene fluoride (VDF)-tetrafluoroethylene (TFE)-perfluoromethyl vinyl ether (PMVE)-based polymer, and a vinylidene fluoride (VDF)-perfluoromethyl vinyl ether (PMVE)-based polymer.

Crosslinkability can be imparted to the FKM by copolymerizing a monomer having a crosslinking site (or by including a constituent unit derived from the monomer). Examples of the monomer having the crosslinking site are the same as those of the FFKM.

The crosslinkable fluoroelastomer's crosslinking system is not particularly limited, and for example for the FFKM, the crosslinking system includes a peroxide crosslinking system, a bisphenol crosslinking system, a triazine crosslinking system, an oxasol crosslinking system, an imidazole crosslinking system, and a thiazole crosslinking system, and for the FKM, the crosslinking system includes a peroxide crosslinking system, a polyamine crosslinking system, and a polyol crosslinking system.

The crosslinkable fluoroelastomer may be crosslinked in any one type of crosslinking system or may be crosslinked in two or more types of crosslinking systems.

The crosslinkable fluoroelastomer composition can include a crosslinking agent depending on the crosslinkable fluoroelastomer's crosslinking system.

Examples of a peroxide crosslinking agent (a radical polymerization initiator) used in the peroxide crosslinking system include organic peroxides such as 2,5-dimethyl-2,5-di(t-butylperoxy) hexane (an example of a commercially available product thereof: "PERHEXA 25B" produced by NOF CORPORATION); dicumyl peroxide (an example of a commercially available product thereof "PERCUMYL D" produced by NOF CORPORATION); 2,4-dichlorobenzoyl peroxide; di-t-butyl peroxide; t-butyl dicumyl peroxide; benzoyl peroxide (an example of a commercially available product thereof: "Nyper B" produced by NOF CORPORATION); 2,5-dimethyl-2,5-(t-butylperoxy) hexyne-3 (an example of a commercially available product thereof: "PERHEXYNE 25B" produced by NOF CORPORATION); 2,5-dimethyl-2,5-di(benzoylperoxy) hexane; α, α'-bis(t-butylperoxy-m-isopropyl) benzene (an example of a commercially available product thereat "PERBUTYL P" produced by NOF CORPORATION); t-butylperoxyisopropyl carbonate; and parachlorobenzoyl peroxide.

Only one type of peroxide crosslinking agent may be used alone or two or more types of peroxide crosslinking agents may be used together.

For the peroxide crosslinking system, a co-crosslinking agent can be used in combination with a peroxide crosslinking agent. Examples of the co-crosslinking agent can be radically co-crosslinkable compounds (unsaturated polyfunctional compounds) such as triallyl isocyanurate (an example of a commercially available product thereof "TAIC" manufactured by Nihon Kasei Co., Ltd.); triallyl cyanurate; triallyl formal; triallyl trimellitate; N,N'-m-phenylene bismaleimide; dipropargyl terephthalate; diallyl phthalate; and tetraallyl terephthalamide.

Only one type of co-crosslinking agent may be used alone or two or more types of co-crosslinking agents may be used together. Inter alia, the co-crosslinking agent preferably includes triallyl isocyanurate in view of improving reactivity and compression set characteristics in a high temperature environment (an index of lifetime when used in the high temperature environment), and the like.

Another preferred example of the co-crosslinking agent is a diolefin compound represented by the following formula:

$$CH_2=CH-(CF_2)_n-CH=CH_2$$

where n represents an integer preferably of 4 to 12, more preferably an integer of 4 to 8.

The above triallyl isocyanurate or the like may be used in combination with the diolefin compound.

Examples of a crosslinking agent used in the oxazol crosslinking system include 2,2-bis (3-amino-4-hydroxyphenyl) hexafluoropropane (BOA P); 4,4'-sulfonylbis (2-aminophenol)[bis(3-amino-4-hydroxyphenyl) sulfone], 3,3'-diaminobenzidine, 3,3',4,4'-tetraaminobenzophenone and the like. Preferably, BOAP is used.

For the triazine crosslinking system, crosslinking catalysts such as an organotin compound, onium salts such as a quaternary phosphonium salt and a quaternary ammonium salt, urea, silicon nitride and the like are used.

As the crosslinking agents used in the imidazol crosslinking system and the thiazole crosslinking system, conventionally known crosslinking agents can be used. Examples of the crosslinking agent used in the imidazol crosslinking system include 3,3',4,4'-tetraaminobenzophenone, 3,3'-diaminobenzidine, and the like.

The crosslinking agent is used in an amount (or a total amount when two or more types thereof are used) for example of 0.01 to 20 parts by weight per 100 parts by weight of the crosslinkable fluoroelastomer, and in view of improvement of compression set characteristics in a high temperature environment, preferably 10 parts by weight or less, more preferably 5 parts by weight or less.

The co-crosslinking agent is used in an amount (or a total amount when two or more types thereof are used) for example of 0.1 to 40 parts by weight per 100 parts by weight of the crosslinkable fluoroelastomer, and in view of improvement of compression set characteristics in a high temperature environment, preferably 0.2 to 10 parts by weight.

The crosslinkable fluoroelastomer composition can include an additive such as an anti-aging agent, an antioxidant, a vulcanization accelerator, a processing aid (such as stearic acid), a stabilizer, an adhesion imparting agent, a silane coupling agent, a plasticizer, a flame retardant, a mold release agent, waxes, lubricant, and the like, as needed, for better processability, physical property adjustment, and the like. Another example of the additive is an adhesion reducing (or preventing) agent such as a fluorine-based oil (e.g., perfluoroether etc).

Only one type of additive may be used alone or two or more types of additives may be used together.

However, when the laminate is used in a high temperature environment or the like, it is preferable that the additive be used in a minimal amount (for example, 10 parts by weight or less, preferably 5 parts by weight or less, more preferably 2 parts by weight or less, still more preferably 1 part by weight or less per 100 parts by weight of the crosslinkable fluoroelastomer) as it may cause volatilization, elution or precipitation, and it is desirable that the additive be not contained.

The crosslinkable fluoroelastomer composition may include, as necessary, an inorganic filler such as silica, alumina, zinc oxide, titanium oxide, clay, talc, diatomaceous earth, barium sulfate, calcium carbonate, magnesium carbonate, calcium oxide, mica, graphite, aluminum hydroxide, aluminum silicate, hydrotalcite, metal powder, glass powder, and ceramic powder.

However, it is preferable that the inorganic filler be used in a minimal amount (for example, 10 parts by weight or less, preferably 5 parts by weight or less, more preferably 2 parts by weight or less, still more preferably 1 part by weight or less per 100 parts by weight of the crosslinkable fluoroelastomer) as it may scatter in a severe environment when it is contained in a large amount, and it is desirable that the inorganic filler be not blended. Note that an inorganic filler refers to a filler which contains a metal element (Ba, Ti, Zn, Al, Mg, Ca, Si etc.).

Fluoroelastomer layer 30 normally has a thickness of 0.5 to 10 mm, and preferably 1 to 7 mm from the viewpoint of sealability and heat resistance.

(4) Application of Laminate

The laminate according to the present invention is suitably applicable as a seal material, and more specifically, suitably applicable as a gate seal or the like provided to a gate of a vacuum chamber. In particular, the laminate according to the present invention is suitably applicable as a gate seal used in an environment in which a conventional laminate using an adhesive would easily have peeling between the metal substrate and the fluoroelastomer layer (e.g., in a high temperature environment, a corrosive environment, a UV environment, a plasma environment and the like), e.g., a gate seal for a semiconductor manufacturing apparatus.

<Method for Manufacturing the Laminate>

The laminate can be suitably manufactured for example in a method including the following steps:

the step of providing metal substrate 10 having a surface with anodic oxide coating 11 formed thereon (a first step);

the step of forming fluororesin layer 20 on a surface of anodic oxide coating 11 of metal substrate 10 (a second step);

the step of forming a layer including a crosslinkable fluoroelastomer on a surface of fluororesin layer 20 facing away from metal substrate 10 (a third step); and the step of crosslinking the layer including the crosslinkable fluoroelastomer to form fluoroelastomer layer 30 (a fourth step).

The laminate obtained by the above manufacturing method can be excellent in peel strength between the metal substrate and the fluoroelastomer layer.

(1) First Step

Metal substrate 10 having a surface with anodic oxide coating 11 formed thereon can be obtained by anodizing the metal substrate (through an electrolysis process with the metal substrate as an anode).

Anodic oxide coating 11 is controllable in thickness by an amount of electric power (an amount of an electric current, a period of time for the electrolysis process, etc.) and the like. Anodic oxide coating 11 has a pore diameter controllable by voltage applied or the like.

Metal substrate 10 having a surface with anodic oxide coating 11 formed thereon may be a commercially available product.

(2) Second Step

Fluororesin layer 20 is formed on a surface of anodic oxide coating 11 preferably by fusion-bonding fluororesin to the surface of anodic oxide coating 11. Fusion bonding is to fuse fluororesin and apply (or dispose) the fused resin to (or on) the surface. This can cause the fused resin to enter the pores of anodic oxide coating 11, which is advantageous in improving peel strength.

Instead of fluororesin, a fluororesin composition including fluororesin and another component (for example, the above-mentioned additive) may be applied to the surface.

When the fused resin (or a resin composition including the same) is applied to the surface, the resin's temperature may be any temperature at which the resin is fused, and for example it is fluororesin's melting point or higher and it is 150 to 310° C., preferably 180 to 250° C. Excessively high temperature of the resin results in reduction in handleability and further may result in degradation of the resin.

After the fused resin is applied to the surface, it is cooled or the like and thus solidified to form fluororesin layer 20.

(3) Third and Fourth Steps

A layer including a crosslinkable fluoroelastomer is formed on a surface of fluororesin layer 20 facing away from metal substrate 10 for example by forming the above-mentioned crosslinkable fluoroelastomer composition including a crosslinkable fluoroelastomer into a predetermined shape (in size and thickness) to be a sheet which is in turn disposed on the surface.

The composition may be formed into the predetermined shape in a conventionally known method, and this is done at a temperature for example of about 130 to 280° C.

Subsequently, the layer including the crosslinkable fluoroelastomer is crosslinked at high temperature with pressure applied thereto to obtain a laminate. It is crosslinked normally at a temperature of about 150 to 280° C.

If necessary, for example, secondary crosslinking may be performed at a temperature of about 150 to 320° C. in order to enhance the laminate in heat resistance. Secondary crosslinking may be performed by exposure to ionizing radiation. For the ionizing radiation, an electron beam, y-ray, or the like can be preferably used.

EXAMPLES

Hereinafter, while the present invention will be described in more detail by way of examples and comparative examples, the present invention is not limited thereto.

Example 1

A laminate was produced according to the following procedure:

A plate-shaped aluminum substrate (made of an aluminum alloy and having a thickness of 1 mm) having one major surface with an anodic oxide coating thereon was prepared. A result of a measurement of the anodic oxide coating's thickness and surface roughness parameters is shown in Table 1. The anodic oxide coating had a pore diameter of 0.8 to 2.1 µm, as measured with a SEM manufactured by Hitachi High-Tech Fielding Corporation, referred to as "SN-3400N."

The anodic oxide coating's thickness was measured with FISCHERSCOPE "XDL 210" manufactured by Fischer Instruments K.K. It was measured at any five points and their average value was determined as the thickness. The same applied to other examples and comparative examples.

The anodic oxide coating's surface roughness parameters (arithmetic mean roughness Ra, maximum height roughness Ry and ten-spot average roughness Rz as defined in JIS B 0601: 1994) were measured with a laser microscope (VK-8510 manufactured by KEYENCE CORPORATION). The surface roughness parameters were each measured at any five points and their average value was determined as the surface roughness parameter. The same applied to other examples and comparative examples.

As fluororesin, ETFE resin ("LM-ETFE" manufactured by AGC Inc., having a melting point of 225° C. and not containing a constitutional unit derived from a monomer having a crosslinking site) was prepared. The ETFE resin was heated to 225° C. and thus fused, and pressed and thus bonded to a surface of the anodic oxide coating of the aluminum substrate.

The following components were kneaded by an open roll mill to prepare a fluoroelastomer composition.

| | |
|---|---|
| FFKM (perfluoroelastomer) | 100 parts by weight |
| Organic peroxide | 1 part by weight |
| Co-crosslinking agent | 2 parts by weight |

As the FFKM, a tetrafluoroethylene (TFE)-perfluoro (alkyl vinyl ether)-based copolymer manufactured by Solvay S.A., referred to as Tecnoflon PFR94 (in Table 1, it is indicated as "FFKM") was used.

As the organic peroxide, a peroxide manufactured by NOF Corporation, referred to as "PERHEXA 25B" (chemical name: 2,5-dimethyl-2,5-di(t-butylperoxy) hexane) was used.

As the co-crosslinking agent, triallyl isocyanurate manufactured by Nihon Kasei Co., Ltd., referred to as "TAIC," was used.

The above fluoroelastomer composition was press-molded at 180° C. for 20 minutes to produce a crosslinkable fluoroelastomer sheet.

The above fluoroelastomer sheet was disposed on a surface of the fluororesin layer facing away from the aluminum substrate, and subsequently heat-treated at 225° C. for 20 minutes to crosslink the fluoroelastomer sheet, and furthermore, secondarily crosslinked at 180° C. for 48 hours to obtain a laminate having a structure of an aluminum substrate/a fluororesin layer/a fluoroelastomer layer. The fluoroelastomer layer had a thickness of 2 mm, as measured with a vernier caliper (it was measured at any five points, and their average value was taken as the thickness).

The thickness of the fluororesin layer in the obtained laminate was measured with a vernier caliper (it was measured at any five points, and their average value was taken as the thickness).

Examples 2 to 13

Laminates were produced in the same manner as Example 1, except that for each example, the thickness of the anodic oxide coating, the surface roughness parameters of the anodic oxide coating, the type of the fluororesin layer, the thickness of the fluororesin layer, and the type of the fluoroelastomer layer are as shown in Table 1.

In Examples 2 to 13, when PFA resin was used to form the fluororesin layer, it was heated to 315° C. and thus fused, and when FEP resin was used to do so, it was heated to 270° C. and thus fused.

Examples 2 to 13 each had a fluoroelastomer layer equal in thickness to that of Example 1.

In Examples 2 to 13, fluoroelastomer layers were formed using the following fluoroelastomer compositions:

Example 2: a fluoroelastomer composition obtained by kneading the following components by an open roll mill

| | |
|---|---|
| FKM (polyvinylidene fluoride, G-755 manufactured by Daikin Industries, Ltd.) | 100 parts by weight |
| MT carbon black (Thermax N-990 manufactured by Cancarb Limited) | 20 parts by weight |
| magnesium oxide (KYOWAMAG 30 manufactured by Kyowa Chemical Industry Co. Ltd.) | 15 parts by weight |
| vulcanizing agent (V-3 manufactured by Daikin Industries, Ltd.) | 3 parts by weight |

When this fluoroelastomer composition was used, it was press-molded at 160° C. for 20 minutes, and then 310° C. for 10 minutes, and secondarily crosslinked at 150° C. for 48 hours.

Example 3: a fluoroelastomer composition identical to that in Example 1

Example 4: a fluoroelastomer composition obtained by kneading the following components by an open roll mill

| | |
|---|---|
| FKM (a vinylidene fluoride/hexafluoropropylene copolymer, referred to as G-755, manufactured by Daikin Industries, Ltd.) | 100 parts by weight |
| SRF carbon black (SEAST S manufactured by Tokai Carbon Co., Ltd.) | 13 parts by weight |
| calcium hydroxide (CALDIC #2000 manufactured by Ohmi Chemical Industry Co., Ltd.) | 6 parts by weight |
| magnesium oxide (KYOWAMAG 150 manufactured by Kyowa Chemical Industry Co. Ltd.) | 3 parts by weight |

When this fluoroelastomer composition was used, it was press-molded at 160° C. for 45 minutes, and then 275° C. for 10 minutes, and secondarily crosslinked at 150° C. for 48 hours.

Example 5: a fluoroelastomer composition identical to that in Example 1

Example 6: a fluoroelastomer composition identical to that in Example 2

Example 7: a fluoroelastomer composition identical to that in Example 1

Example 8: a fluoroelastomer composition identical to that in Example 4

Example 9: a fluoroelastomer composition identical to that in Example 1

Example 10: a fluoroelastomer composition identical to that in Example 2

Example 11: a fluoroelastomer composition identical to that in Example 1

Example 12: a fluoroelastomer composition identical to that in Example 4

Example 13: a fluoroelastomer composition identical to that in Example 1

In Examples 2 to 13, anodic oxide coatings had their respective pore diameters measured in the same method as in Example 1, as follows:

Example 2: 0.05 to 0.09 μm
Example 3: 0.05 to 0.08 μm
Example 4: 0.06 to 0.1 μm
Example 5: 0.07 to 0.09 μm
Example 6: 1.7 to 1.9 μm
Example 7: 1.7 to 1.9 μm
Example 8: 1.5 to 1.8 μm
Example 9: 1.5 to 1.9 μm
Example 10: 5.0 to 5.3 μm
Example 11: 5.0 to 5.2 μm
Example 12: 10.6 to 10.9 μm
Example 13: 10.5 to 11.0 μm In Table 1, the following abbreviations' details are as follows:

[1] PFA: "NEOFLON PFA" manufactured by Daikin Industries, Ltd., having a melting point of 305° C. and not containing a constitutional unit derived from a monomer having a crosslinking site.

[2] ETFE: "LM-ETFE" manufactured by AGC Inc., having a melting point of 225° C. and not containing a constitutional unit derived from a monomer having a crosslinking site.

[3] FEP: "NEOFLON" manufactured by Daikin Industries, Ltd., having a melting point of 270° C. and not containing a constitutional unit derived from a monomer having a crosslinking site.

Comparative Example 1

A laminate was produced according to the following procedure:

A plate-shaped aluminum substrate (made of an aluminum alloy and having a thickness of 1.5 mm) without undergoing anodization (or an aluminum anodizing process) was prepared.

In addition, the same fluoroelastomer sheet as in Example 1 was prepared.

On one major surface of the aluminum substrate, a silane coupling agent-based adhesive manufactured by TOYOKAGAKU KENKYUSHO CO., LTD., referred to as "META-LOC S-10A," was applied so that a laminate obtained after a crosslinking process would have a thickness of 0.1 μm, and the above-described fluoroelastomer sheet was disposed on the adhesive layer. After that, a heat treatment was performed at 180° C. for 20 minutes to crosslink the fluoroelastomer sheet, and secondary crosslinking was further perfotined at 200° C. for 48 hours to obtain a laminate having a structure of an aluminum substrate/an adhesive layer/a fluoroelastomer layer. The fluoroelastomer layer had the same thickness as that in Example 1.

Comparative Example 2

A laminate was produced according to the following procedure:

A plate-shaped aluminum substrate (made of an aluminum alloy and having a thickness of 1 mm) without undergoing anodization (or an aluminum anodizing process) was prepared.

The same ETFE resin as in Example 1 was prepared.

In addition, the same fluoroelastomer sheet as in Example 1 was prepared.

On one major surface of the aluminum substrate, a silane coupling agent-based adhesive manufactured by TOYOKAGAKU KENKYUSHO CO., LTD., referred to as "META-LOC S-10A," was applied so that a laminate obtained after a crosslinking process would have a thickness of 0.1 Ξm, and an adhesive layer was thus formed. The ETFE resin was heated to 225° C. and compression-molded. The subsequent steps were performed in the same manner as in Example 1 to obtain a laminate having a structure of an aluminum substrate/an adhesive layer/a fluororesin layer/a fluoroelastomer layer. The fluoroelastomer layer had the same thickness as that in Example 1.

The thickness of the fluororesin layer in the obtained laminate was measured with a vernier caliper, and it was 50 μm (it was measured at any five points, and their average value was taken as the thickness).

(Evaluation of Peel Strength)

Using a tensile tester ("TG-50kN" manufactured by MinebeaMitsumi Inc.), a 90° peeling test specified in JIS K 6256-2: 2013 was conducted to measure peel strength between the aluminum substrate and the fluoroelastomer layer at 23° C. A result is shown in Table 1. The size of the test piece was 125 mm in length and 25 mm in width according to the above-mentioned JIS standard.

TABLE 1

|  |  |  | Examples ||||||||| 
|---|---|---|---|---|---|---|---|---|---|---|---|
|  |  |  | 1 | 2 | 3 | 4 | 5 | 6 | 7 | 8 | 9 |
| aluminum substrate | thickness of anodic oxide coating (μm) |  | 0.1 | 0.1 | 0.1 | 0.1 | 0.1 | 5 | 5 | 10 | 10 |
|  | surface roughness (μm) | Ra | 0.08 | 0.08 | 0.07 | 0.08 | 0.08 | 1.8 | 1.8 | 1.6 | 1.7 |
|  |  | Ry | 0.09 | 0.09 | 0.08 | 0.09 | 0.09 | 7.3 | 7.8 | 12.3 | 12.5 |
|  |  | Rz | 0.15 | 0.15 | 0.15 | 0.16 | 0.12 | 11.1 | 7.1 | 10.9 | 10.9 |
| adhesive layer |  |  | — | — | — | — | — | — | — | — | — |
| fluororesin layer | PFA | thickness (μm) | — | 0.1 | 0.1 | — | — | — | — | — | — |
|  | ETFE |  | 0.1 | — | — | — | — | 50 | 50 | 50 | 50 |
|  | FEP |  | — | — | — | 0.1 | 0.1 | — | — | — | — |
| fluoroelastomer layer | type |  | FFKM | FKM | FFKM | FKM | FFKM | FKM | FFKM | FKM | FFKM |
| peel strength (N/mm) |  |  | 1.5 | 1.5 | 1.6 | 1.5 | 1.3 | 3.5 | 3.1 | 3.1 | 3.2 |

|  |  |  | Examples |||| Comparative Examples ||
|---|---|---|---|---|---|---|---|---|
|  |  |  | 10 | 11 | 12 | 13 | 1 | 2 |
| aluminum substrate | thickness of anodic oxide coating (μm) |  | 30 | 30 | 100 | 100 | — | — |
|  | surface roughness (μm) | Ra | 5.2 | 5.2 | 10.8 | — | — | — |
|  |  | Ry | 27.3 | 27.3 | 97.2 | 95.3 | — | — |
|  |  | Rz | 31.5 | 31.5 | 96.4 | 100.4 | — | — |
| adhesive layer |  |  | — | — | — | — | present | present |
| fluororesin layer | PFA | thickness (μm) | — | — | — | — | — | — |
|  | ETFE |  | 50 | 500 | 1000 | 1000 | — | 50 |
|  | FEP |  | — | — | — | — | — | — |
| fluoroelastomer layer | type |  | FKM | FFKM | FKM | FFKM | FFKM | FFKM |
| peel strength (N/mm) |  |  | 3.2 | 3.1 | 3.4 | 3.0 | 0.1 | 0.2 |

Except that in each of Examples 4 and 6 a fluoroelastomer composition obtained by kneading the below-indicated components with an open roll mill was used as a fluoroelastomer composition used to form a fluoroelastomer layer, laminates were produced in the same manners as in Examples 4 and 6, and evaluated for peel strength, and the same values as Examples 4 and 6 were obtained.

| | |
|---|---|
| FKM (a vinylidene fluoride-hexafluoropropylene-tetrafluoroethylene copolymer (a VDF-HFP-TFE copolymer), manufactured by Solvay S.A., referred to as Tecnoflon P459) | 100 parts by weight |
| organic peroxide | 1 part by weight |
| co-crosslinking agent | 2 parts by weight |

As the organic peroxide, a peroxide manufactured by NOF Corporation, referred to as "PERHEXA 25B" (chemical name: 2,5-dimethyl-2,5-di(t-butylperoxy) hexane) was used.

As the co-crosslinker, triallyl isocyanurate manufactured by Nihon Kasei Co., Ltd., referred to as "TAIC," was used.

Example 14

Experiment for Reuse of Aluminum Substrate

An aluminum substrate (having a fluororesin layer) recovered from the laminate of Example 10 having undergone the above-described peel strength evaluation test (for the first time) was used to fabricate a laminate in the same manner as in Example 10, and the obtained laminate was subjected to the peel strength evaluation test again (for the second time). This operation was repeated, and the evaluation test was thus performed five times in total. A result the evaluation test conducted five times is shown in Table 2.

TABLE 2

|  | peel strength evaluation test |||||
|---|---|---|---|---|---|
|  | 1st time | 2nd time | 3rd time | 4th time | 5th time |
| peel strength (N/mm) | 3.2 | 3.3 | 3.3 | 3.4 | 3.1 |

As shown in Table 2, the laminate according to the present invention can maintain high peel strength between the aluminum substrate and the fluoroelastomer layer even when the aluminum substrate is repeatedly reused.

In addition, when the laminate of Example 10 was heated to 225° C. and thus fused, the fluororesin layer and the fluoroelastomer layer were easily peeled off and thus removed from the aluminum substrate.

REFERENCE SIGNS LIST 10 metal substrate, 11 anodic oxide coating, 20 fluororesin layer, 30 fluoroelastomer layer.

The invention claimed is:

1. A laminate comprising:
    a metal substrate having a surface with an anodic oxide coating formed thereon;
    a fluororesin layer, consisting of fluororesin, fusion-bonded to the anodic oxide coating; and
    a fluoroelastomer layer laminated in contact with a surface of the fluororesin layer facing away from the metal substrate.

2. The laminate according to claim 1, wherein the fluoroelastomer layer includes a crosslinked product of a crosslinkable perfluoroelastomer.

3. The laminate according to claim 1, wherein the anodic oxide coating has an arithmetic average roughness Ra, as defined in JIS B 0601: 1994, of 0.05 to 100 μm.

4. The laminate according to claim 1, wherein the metal substrate includes aluminum.

5. A gate seal comprising the laminate according to claim 1.

6. A method for manufacturing a laminate, comprising:
providing a metal substrate having a surface with an anodic oxide coating formed thereon;
fusion-bonding a fluororesin layer, consisting of fluororesin, on a surface of the anodic oxide coating;
forming a layer including a crosslinkable fluoroelastomer on a surface of the fluororesin layer facing away from the metal substrate; and
crosslinking the layer including the crosslinkable fluoroelastomer to form a fluoroelastomer layer.

7. The method for manufacturing a laminate according to claim 6, wherein forming the fluororesin layer includes disposing fused fluororesin on a surface of the anodic oxide coating and subsequently solidifying the disposed, fused fluororesin.

8. The method for manufacturing a laminate according to claim 6, wherein the crosslinkable fluoroelastomer is a crosslinkable perfluoroelastomer.

9. The method for manufacturing a laminate according to claim 6, wherein the anodic oxide coating has an arithmetic average roughness Ra, as defined in JIS B 0601: 1994, of 0.05 to 100 µm.

10. The method for manufacturing a laminate according to claim 6, wherein the metal substrate includes aluminum.

\* \* \* \* \*